United States Patent
Hong

(10) Patent No.: US 12,052,027 B2
(45) Date of Patent: Jul. 30, 2024

(54) ANALOG-TO-DIGITAL CONVERSION CIRCUIT AND METHOD HAVING SPEED-UP COMPARISON MECHANISM

(71) Applicant: REALTEK SEMICONDUCTOR CORPORATION, Hsinchu (TW)

(72) Inventor: Wei-Cian Hong, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 180 days.

(21) Appl. No.: 17/946,072

(22) Filed: Sep. 16, 2022

(65) Prior Publication Data
US 2023/0188153 A1 Jun. 15, 2023

(30) Foreign Application Priority Data
Dec. 9, 2021 (TW) ................. 110146083

(51) Int. Cl.
*H03M 1/34* (2006.01)
*H03M 1/46* (2006.01)
*H03M 1/80* (2006.01)
*H03M 1/82* (2006.01)

(52) U.S. Cl.
CPC .............. *H03M 1/34* (2013.01); *H03M 1/466* (2013.01); *H03M 1/80* (2013.01); *H03M 1/804* (2013.01); *H03M 1/82* (2013.01)

(58) Field of Classification Search
CPC ........ H03M 1/34; H03M 1/466; H03M 1/804; H03M 1/80; H03M 1/82
See application file for complete search history.

(56) References Cited

U.S. PATENT DOCUMENTS 8,368,578 B2 2/2013 Harpe
2023/0011062 A1* 1/2023 Lee ..................... H03M 1/1023

OTHER PUBLICATIONS

A 12 bit 100 MS/s SAR-Assisted Digital-Slope ADC, Chun-Cheng Liu, Member, IEEE, Mu-Chen Huang, and Yu-Hsuan Tu, Dec. 2016, pp. 2941-2950, vol. 51, No. 12, IEEE Journal of Solid-State Circuits.

* cited by examiner

*Primary Examiner* — Joseph J Lauture
(74) *Attorney, Agent, or Firm* — WPAT, P.C

(57) ABSTRACT

The present invention discloses an analog-to-digital conversion circuit having speed-up comparison mechanism. Each of a positive and a negative capacitor arrays receives a positive and a negative input voltages to generate a positive and a negative output voltages. A first comparator performs comparison thereon to generate a first comparison result and a second comparator performs comparison according to a reference voltage to generate a second comparison result. A control circuit switches a capacitor enabling combination of the capacitor arrays according to the first comparison result and outputs a digital code as a digital output signal when the positive and the negative output voltages equal. The control circuit operates in a speed-up switching mode when a difference between the positive and the negative output voltages is outside of a predetermined range defined by the reference voltage and operates in a normal switching mode when the difference is within the predetermined range.

10 Claims, 5 Drawing Sheets

ANALOG-TO-DIGITAL CONVERSION CIRCUIT AND METHOD HAVING SPEED-UP COMPARISON MECHANISM

BACKGROUND OF THE INVENTION

1. Field of the Invention

The present invention relates to an analog-to-digital conversion circuit and an analog-to-digital conversion method having speed-up comparison mechanism.

2. Description of Related Art

An analog-to-digital conversion circuit is a circuit that converts a continuous analog signal or a physical amount (which is typically a voltage) to a digital signal. The analog-to-digital conversion circuit can be implemented by various kinds of configurations. A conventional digital slope analog-to-digital conversion circuit gradually switches capacitors in a capacitor array thereof in a linear way to track an input signal that is sampled. As a result, such an analog-to-digital conversion circuit has a slower operation speed and is too time-consuming.

SUMMARY OF THE INVENTION

In consideration of the problem of the prior art, an object of the present invention is to supply an analog-to-digital conversion circuit and an analog-to-digital conversion method having speed-up comparison mechanism.

The present invention discloses an analog-to-digital conversion circuit having speed-up comparison mechanism that includes a positive capacitor array, a negative capacitor array, a first comparator, a second comparator and a control circuit. The positive capacitor array is configured to receive a positive input voltage and output a positive output voltage. The negative capacitor array is configured to receive a negative input voltage and output a negative output voltage. The first comparator is configured to compare the positive output voltage and the negative output voltage to generate a first comparison result. The second comparator is configured to compare the positive output voltage and the negative output voltage according to a reference voltage to generate a second comparison result. The control circuit is configured to receive the first comparison result and the second comparison result. The control circuit switches a capacitor enabling combination of the positive capacitor array and the negative capacitor array according to the first comparison result by using a digital code in each of a plurality of switching stages, and outputs the corresponding digital code as a digital output signal when the positive output voltage and the negative output voltage equal to each other. The control circuit, according to the second comparison result, operates in a speed-up switching mode when a difference between the positive output voltage and the negative output voltage is beyond a predetermined range defined by the reference voltage to control the positive capacitor array and the negative capacitor array to switch according to a first capacitor switching speed, and operates in a normal switching mode when the difference is within the predetermined range to control the positive capacitor array and the negative capacitor array to switch according to a second capacitor switching speed, the first capacitor switching speed being larger than the second capacitor switching speed.

The present invention also discloses an analog-to-digital conversion method having speed-up comparison mechanism includes steps outlined below. A positive input voltage is received and a positive output voltage is outputted by a positive capacitor array. A negative input voltage is received and a negative output voltage is outputted by a negative capacitor array. The positive output voltage and the negative output voltage are compared to generate a first comparison result by a first comparator. The positive output voltage and the negative output voltage are compared according to a reference voltage to generate a second comparison result by a second comparator. The first comparison result is received by a control circuit to switch a capacitor enabling combination of the positive capacitor array and the negative capacitor array according to the first comparison result by using a digital code in each of a plurality of switching stages, and output the corresponding digital code as a digital output signal when the positive output voltage and the negative output voltage equal to each other. The second comparison result is received by the control circuit to, according to the second comparison result, operate in a speed-up switching mode when a difference between the positive output voltage and the negative output voltage is beyond a predetermined range defined by the reference voltage to control the positive capacitor array and the negative capacitor array to switch according to a first capacitor switching speed, and operate in a normal switching mode when the difference is within the predetermined range to control the positive capacitor array and the negative capacitor array to switch according to a second capacitor switching speed, the first capacitor switching speed being larger than the second capacitor switching speed.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide an analog-to-digital conversion circuit and an analog-to-digital conversion method having speed-up comparison mechanism to switch capacitors with different capacitor switching speeds according to different differences between the positive output voltage and the negative output voltage such that an operation speed is fastened when the difference is larger and the accuracy is maintained when the difference is smaller.

Figure 1:
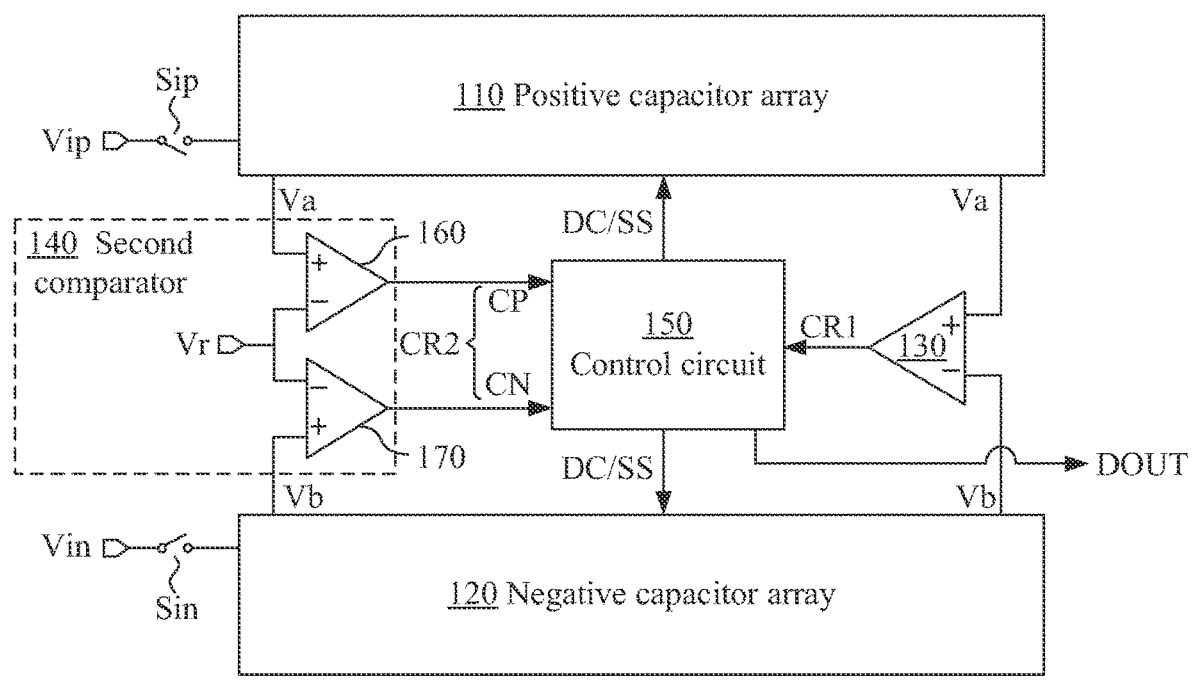
FIG. 1 illustrates a block diagram of an analog-to-digital conversion circuit having speed-up comparison mechanism according to an embodiment of the present invention.

Reference is now made to FIG. 1. FIG. 1 illustrates a block diagram of an analog-to-digital conversion circuit 100 having speed-up comparison mechanism according to an embodiment of the present invention. The analog-to-digital conversion circuit 100 includes a positive capacitor array 110, a negative capacitor array 120, a first comparator 130, a second comparator 140 and a control circuit 150.

The positive capacitor array 110 is configured to receive a positive input voltage Vip and output a positive output voltage Va. More specifically, in an embodiment, the positive capacitor array 110 is coupled to an analog signal source through a switch Sip to receive the positive input voltage Vip. The positive capacitor array 110 further switches a capacitor enabling combination of internal capacitors to generate the positive output voltage Va after the switch Sip is disconnected from the analog signal source.

The negative capacitor array 120 is configured to receive a negative input voltage Vin and output a negative output voltage Vb. More specifically, in an embodiment, the negative capacitor array 120 is coupled to the analog signal source through a switch Sin to receive the negative input voltage Vin. The negative capacitor array 120 further switches a capacitor enabling combination of internal capacitors to generate the negative output voltage Vb after the switch Sin is disconnected from the analog signal source.

The first comparator 130 is configured to compare the positive output voltage Va and the negative output voltage Vb to generate a the first comparison result CR1.

The second comparator 140 is configured to compare the positive output voltage Va and the negative output voltage Vb according to a reference voltage Vr to generate a second comparison result CR2.

The control circuit 150 is configured to receive the first comparison result CR1 and the second comparison result CR2 and control the switching of the capacitor enabling combination of the positive capacitor array 110 and the negative capacitor array 120 accordingly.

The control circuit 150 switches the capacitor enabling combination of the positive capacitor array 110 and the negative capacitor array 120 according to the first comparison result CR1 by using a digital code DC in each of a plurality of switching stages, and outputs the corresponding digital code DC as a digital output signal DOUT when the positive output voltage Va and the negative output voltage Vb equal to each other More specifically, the capacitors in the positive capacitor array 110 and the negative capacitor array 120 are initialized to be disabled. After the positive input voltage Vip and the negative input voltage Vin are received, the control circuit 150 keeps adjusting the digital code DC according to the first comparison result CR1, so as to switch the capacitor enabling combination of the positive capacitor array 110 and the negative capacitor array 120. In an embodiment, in each of the switching stages, the digital code DC switches the capacitors in the positive capacitor array 110 and the negative capacitor array 120 in a form of a thermometer code.

When a set of digital code DC is presented to keep the positive output voltage Va and the negative output voltage Vb equaling to each other, such a set of the digital code DC is the analog-to-digital conversion result of the positive input voltage Vip and the negative input voltage Vin and is outputted as the digital output signal DOUT.

The control circuit 150 determines whether a difference between the positive output voltage Va and the negative output voltage Vb is within a predetermined range defined by the reference voltage Vr according to the second comparison result CR2 generated by the second comparator 140, and operate in either a speed-up switching mode or a normal switching mode.

In an embodiment, the second comparator 140 includes a positive comparator 160 and a negative comparator 170. The positive comparator 160 is configured to compare the positive output voltage Va and the reference voltage Vr to generate a positive comparison result CP included by the second comparison result CR2. The negative comparator 170 is configured to compare the negative output voltage Vb and the reference voltage Vr to generate a negative comparison result CN included by the second comparison result CR2.

The control circuit 150 is configured to set a range between a positive value and a negative value of the reference voltage Vr as the predetermined range, and determine whether the difference between the positive output voltage Va and negative output voltage Vb is within the predetermined range according to the second comparison result CR2. More specifically, when the difference described above is denoted by Vi, the condition that the difference is within the predetermined range is denoted as −Vr≤Vi≤Vr. The condition that the difference is beyond the predetermined range is denoted as Vi<−Vr or Vi>Vr. In a numerical example, the reference voltage Vr can be such as but not limited to 100 millivolts (mV).

It is appreciated that the configuration of the second comparator 140 and the setting of the predetermined range described above is merely an example. In other embodiments, the configuration of the second comparator 140 and the setting of the predetermined range can be different to accomplish the object of comparing the difference between the positive output voltage Va and the negative output voltage Vb.

The control circuit 150 operates in the speed-up switching mode when the difference between the positive output voltage Va and the negative output voltage Vb is beyond the predetermined range, to control the positive capacitor array 110 and the negative capacitor array 120 to switch according to a first capacitor switching speed. Further, the control circuit 150 operates in the normal switching mode when the difference is within the predetermined range to control the positive capacitor array 110 and the negative capacitor array 120 to switch according to a second capacitor switching speed. The first capacitor switching speed is larger than the second capacitor switching speed.

In an embodiment, when the difference is beyond the predetermined range, the control circuit 150 determines that the difference between the positive output voltage Va and the negative output voltage Vb is larger so as to control the positive capacitor array 110 and the negative capacitor array 120 operates with a faster capacitor switching speed to speed up the comparison process. When the difference is within the predetermined range, the control circuit 150 determines that the difference between the positive output voltage Va and the negative output voltage Vb is smaller and close so as to control the positive capacitor array 110 and the negative capacitor array 120 operates with a slower capacitor switching speed to increase the accuracy of the comparison.

Figure 2:
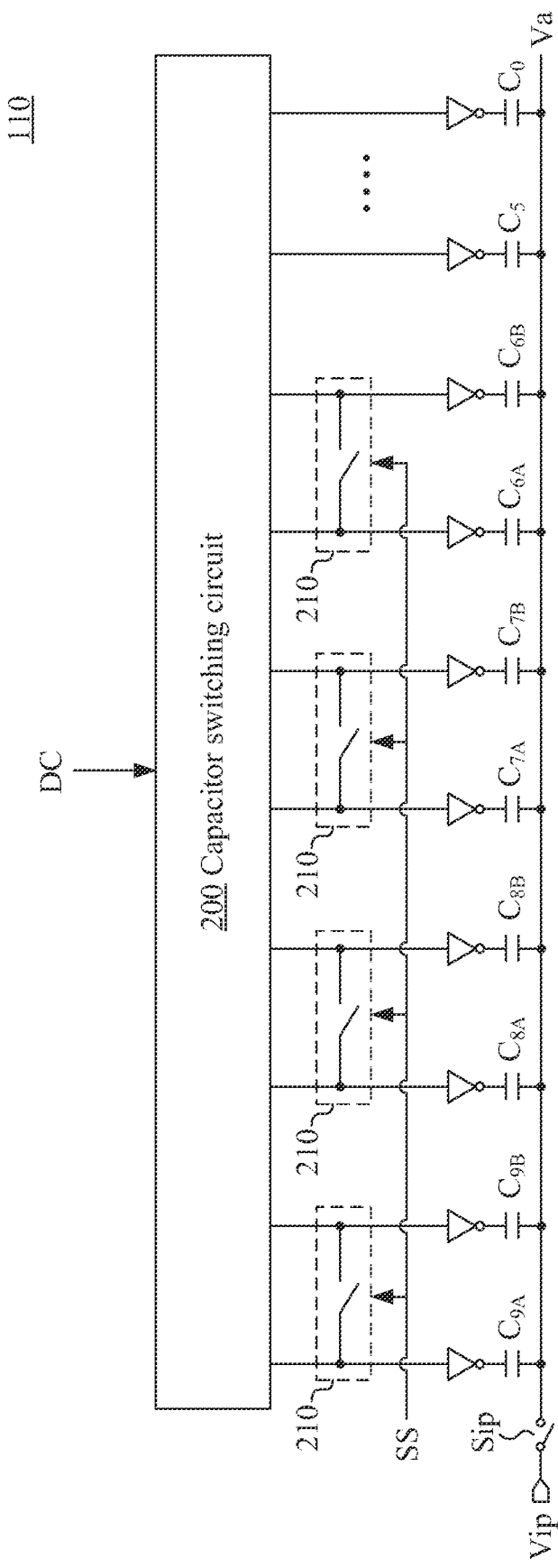
FIG. 2 illustrates a detailed circuit diagram of the positive capacitor array according to an embodiment of the present invention.

Reference is now made to FIG. 2. FIG. 2 illustrates a detailed circuit diagram of the positive capacitor array 110 according to an embodiment of the present invention. The configuration of the comparison capacitor array and the speed-up comparison mechanism are described in accompany with FIG. 2, in which the positive capacitor array 110 is used as an example. The negative capacitor array 120 may include the same configuration and operation as those of the positive capacitor array 110. No further detail is described herein.

The positive capacitor array 110 includes a plurality of capacitors, a capacitor switching circuit 200 and a plurality of speed-up switching circuits 210.

In the present embodiment, the positive capacitor array 110 includes capacitors C0~C5, C6A, C6B, C7A, C7B, C8A, C8B, C9A and C9B. These capacitors include a plurality of groups of corresponding capacitors, in which in the present embodiment, four groups of corresponding capacitors each including two capacitors, namely "C6A and C6B", "C7A and C7B", "C8A and C8B" and "C9A and C9B" are included these capacitors.

The capacitor switching circuit 200 is electrically coupled to the capacitors described above and is configured to switch and enable the corresponding capacitors according to the digital code DC.

Each of the speed-up switching circuits 210 is electrically coupled to a group of the corresponding capacitors and is configured to simultaneously enable the group of corresponding capacitors according to a speed-up switching signal SS. In an embodiment, each of the speed-up switching circuits 210 is a switching element disposed among a group of the corresponding capacitors to form a conduction path under the control of the speed-up switching signal SS to couple such a group of the corresponding capacitors.

As a result, the control circuit 150 in FIG. 1, operating in the speed-up switching mode and in each of the switching stages, enables a target capacitor of the capacitors through the capacitor switching circuit 200 according to the digital code DC, and simultaneously enables the group of the corresponding capacitors that corresponds to the target capacitor through the speed-up switching circuits 210 according to the speed-up switching signal SS.

The control circuit 150 in FIG. 1, operating in the normal switching mode and in each of the switching stages, only enables the target capacitor of the capacitors through the capacitor switching circuit 200 according to the digital code DC.

Take a usage scenario as an example, when the positive capacitor array 110 and the negative capacitor array 120 respectively receive the positive input voltage Vip and the negative input voltage Vin, the capacitors in the positive capacitor array 110 and the negative capacitor array 120 are initialized to be disabled. Since the difference between the positive output voltage Va and the negative output voltage Vb is larger, the control circuit 150 not only adjusts the digital code DC according to the first comparison result CR1, but also operates in the speed-up switching mode according to the second comparison result CR2 that indicates the difference being beyond the predetermined range.

As a result, under the control of the digital code DC with the thermometer code, the control circuit 150 sets the capacitor C9A to be the target capacitor in the first switching stage, enables the capacitor C9A through the capacitor switching circuit 200 and further enables the capacitors C9B related to the capacitor C9A (within the same group of the corresponding capacitors) simultaneously through the speed-up switching circuits 210 by using the speed-up switching signal SS. Identically, under the condition that the second comparison result CR2 keeps showing that the difference is beyond the predetermined range, the control circuit 150 keeps operating in the speed-up switching mode so as to enable the corresponding capacitors C8A and C8B with the same mechanism in the second switching stage and enable the corresponding capacitors C7A and C7B with the same mechanism in the third switching stage.

When the second comparison result CR2 shows that the difference is within the predetermined range, the control circuit 150 operates in the normal switching mode, to enable one capacitor through the capacitor switching circuit 200 in each of the following switching stages (e.g., from the capacitor C6A, the capacitor C6B . . . to the capacitors C0 in each of the switching stages).

Figure 3:
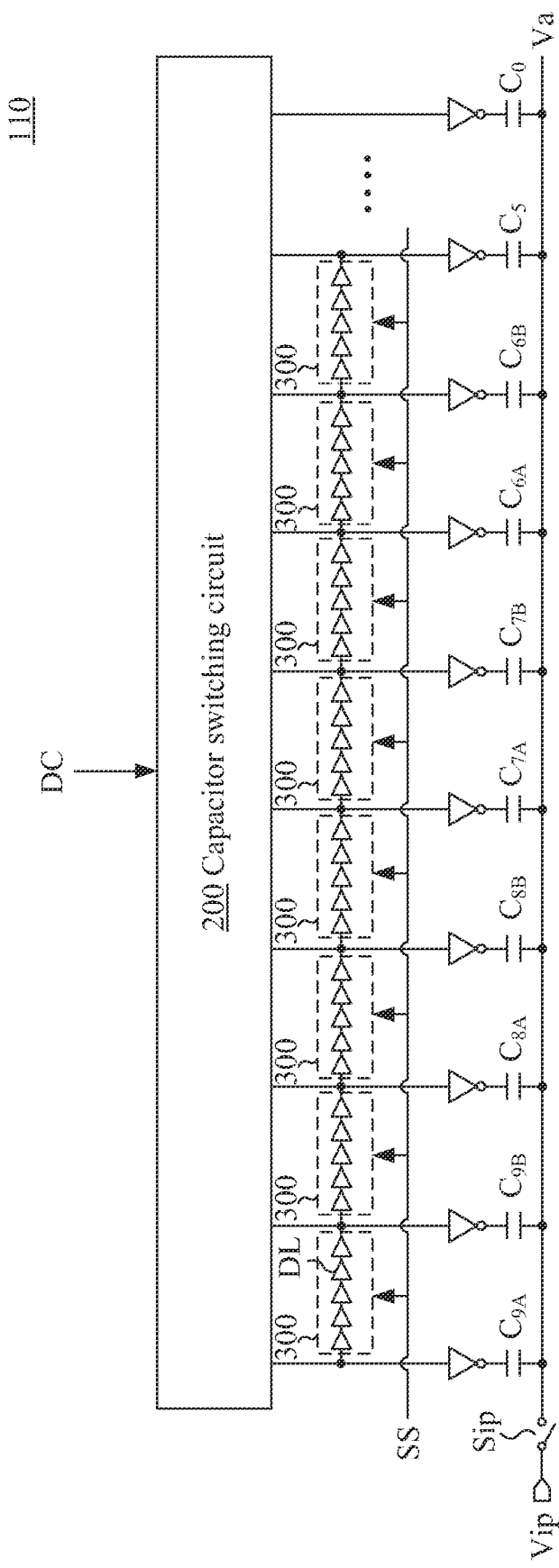
FIG. 3 illustrates a detailed circuit diagram of the positive capacitor array according to another embodiment of the present invention.

Reference is now made to FIG. 3. FIG. 3 illustrates a detailed circuit diagram of the positive capacitor array 110 according to another embodiment of the present invention. The configuration of the comparison capacitor array and the speed-up comparison mechanism are described in accompany with FIG. 3, in which the positive capacitor array 110 is used as an example. The negative capacitor array 120 may include the same configuration and operation as those of the positive capacitor array 110. No further detail is described herein.

The positive capacitor array 110 includes a plurality of capacitors, the capacitor switching circuit 200 and a plurality of the delay circuits 300.

In the present embodiment, the positive capacitor array 110 includes capacitors C0~C5, C6A, C6B, C7A, C7B, C8A, C8B, C9A and C9B.

The capacitor switching circuit 200 is electrically coupled to the capacitors described above and is configured to switch and enable the corresponding capacitors according to the digital code DC.

Each of the delay circuits 300 is electrically coupled to neighboring two of the capacitors, each including a plurality of delay units DL. Each of the delay units DL is illustrated as a buffer in FIG. 3. In an embodiment, the capacitor switching circuit 200 controls the operation of the delay circuits 300 by using such as, but not limited to inverters, related signals (not illustrated in the figure) and logic circuits and switches the capacitors through the delay circuits 300. As a result, the delay units in the delay circuits 300 determine a switching time of the neighboring two of the capacitors. Each of the delay circuits 300 is configured to bypass at least a part of the delay units DL according to the speed-up switching signal SS.

Take the delay circuit 300 between the capacitors C9A and C9B as an example, the delay circuit 300 includes a plurality of delay units DL to determine the switching time between the capacitors C9A and C9B, i.e., a time length of the switching of the capacitors C9A and C9B between two consecutive switching stages.

As a result, the control circuit 150 in FIG. 1, operating in the speed-up switching mode and in each of the switching stages, enables a target capacitor of the capacitors through the capacitor switching circuit 200 according to the digital code DC, and bypasses at least one of the delay units DL of the delay circuit 300 between the target capacitor and a next capacitor according to the speed-up switching signal SS.

The control circuit 150 in FIG. 1, operating in the normal switching mode and in each of the switching stages, only enables the target capacitor of the capacitors through the capacitor switching circuit 200 according to the digital code DC. As a result, the delay units DL are not bypassed by the delay circuit 300.

Take a usage scenario as an example, when the positive capacitor array 110 and the negative capacitor array 120 respectively receive the positive input voltage Vip and the negative input voltage Vin, the capacitors in the positive capacitor array 110 and the negative capacitor array 120 are initialized to be disabled. Since the difference between the positive output voltage Va and the negative output voltage Vb is larger, the control circuit 150 not only adjusts the digital code DC according to the first comparison result CR1, but also operates in the speed-up switching mode according to the second comparison result CR2 that indicates the difference being beyond the predetermined range.

As a result, under the control of the digital code DC with the thermometer code, the control circuit 150 sets the capacitor C9A to be the target capacitor in the first switching stage, enables the capacitor C9A through the capacitor switching circuit 200 and further bypasses the delay units DL in the delay circuit 300 between the capacitor C9A and the next capacitor C9B by using the speed-up switching signal SS. Identically, under the condition that the second comparison result CR2 keeps showing that the difference is beyond the predetermined range, the control circuit 150 keeps operating in the speed-up switching mode so as to bypass the delay units DL in the delay circuit 300 between the capacitor C9B and the next capacitor C8A with the same mechanism in the second switching stage and bypass the delay units DL in the delay circuit 300 between the capacitor C8A and the next capacitor C8B with the same mechanism in the third switching stage.

When the second comparison result CR2 shows that the difference is within the predetermined range, the control circuit 150 operates in the normal switching mode, to enable one capacitor through the capacitor switching circuit 200 in each of the following switching stages (e.g., from the capacitor C7A, the capacitor C7B . . . to the capacitors C0 in each of the switching stages) without bypassing any delay units DL in the related delay circuits 300.

In an embodiment, the analog-to-digital conversion circuit 100 may either use one of or both of the speed-up switching mechanism described in accompany with FIG. 2 and the speed-up switching mechanism described in accompany with FIG. 3. When both of the mechanisms are used, the control circuit 150, operating in the speed-up switching mode, can enable a plurality of corresponding capacitors simultaneously and bypass at least a part of the delay units of the delay circuit 300 between these corresponding capacitors and a next capacitor in each of the switching stages. For example, the control circuit 150 may enable the corresponding capacitors C9A and C9B and bypass the delay units DL of the delay circuit 300 between the capacitors C9B and C9A in a switching stage to accomplish the object of speed-up switching.

It is appreciated that the number of the capacitors included in a group of the corresponding capacitors is merely an example. In other embodiments, the number of the capacitors included in a group of the corresponding capacitors can be a number larger than two to speed up the switching at an even higher speed. Further, different groups of corresponding capacitors may include different numbers of capacitors, in which different predetermined ranges can be set for the second comparator to perform different speeds of switching. Moreover, the delay units included in each of the delay circuits described above is also merely an example. In other embodiments, the number of the delay units can be any number that is two or larger than two.

Figure 4:
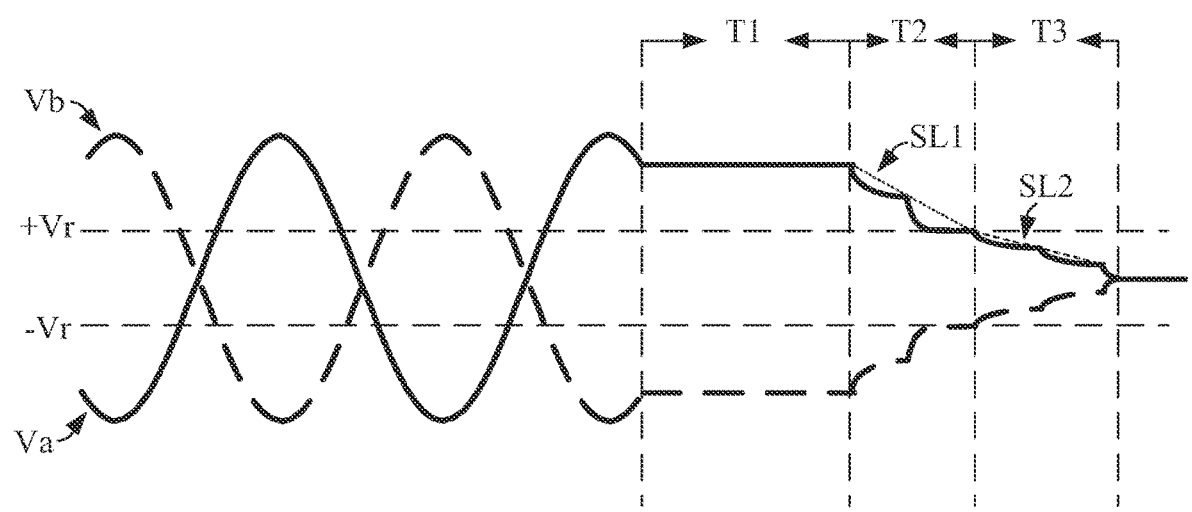
FIG. 4 illustrates a diagram of variations of the positive output voltage and the negative output voltage along with the operation of the analog-to-digital conversion circuit in FIG. 1 according to an embodiment of the present invention.

Reference is now made to FIG. 4. FIG. 4 illustrates a diagram of variations of the positive output voltage Va and the negative output voltage Vb along with the operation of the analog-to-digital conversion circuit 100 in FIG. 1 according to an embodiment of the present invention. In FIG. 4, the positive output voltage Va is illustrated as a solid line and the negative output voltage Vb is illustrated as a dashed line.

As illustrated in FIG. 4, before the time interval T1, the positive capacitor array 110 and the negative capacitor array 120 in FIG. 1 receive the positive input voltage Vip and the negative input voltage Vin through the switches Sip and Sin such that the positive output voltage Va and the negative output voltage Vb respectively equal to the positive input voltage Vip and the negative input voltage Vin.

In the time interval T1, the switches Sip and Sin in FIG. 1 are open such that the positive capacitor array 110 and the negative capacitor array 120 perform sampling and generate the positive output voltage Va and the negative output voltage Vb. The control circuit 150 starts to operate according to the comparison result of the positive output voltage Va and the negative output voltage Vb to switch the capacitors of the capacitor arrays. FIG. 4 also illustrates the positive value+Vr and the negative value−Vr of the reference voltage Vr.

In the time interval T2, the difference between the positive output voltage Va and the negative output voltage Vb is beyond the predetermined range. The control circuit 150 operates in the speed-up switching mode to control the switching of the positive capacitor array 110 and the negative capacitor array 120 such that the positive output voltage Va and the negative output voltage Vb drop along with a first slope. In FIG. 4, the first slope is illustrated as a line section SL1.

In the time interval T3, the difference between the positive output voltage Va and the negative output voltage Vb is within the predetermined range. The control circuit 150 operates in the normal switching mode to control the switching of the positive capacitor array 110 and the negative capacitor array 120 such that the positive output voltage Va and the negative output voltage Vb drop along with a second slope, in which the first slope is larger than the second slope. In FIG. 4, the first slope is illustrated as a line section SL2.

After the time interval T3, the positive output voltage Va and the negative output voltage Vb equal to each other such that the control circuit 150 in FIG. 1 generates the digital output signal DOUT.

As a result, the analog-to-digital conversion circuit of the present invention switches capacitors with different capacitor switching speeds according to different differences between the positive output voltage and the negative output voltage such that an operation speed is fastened when the difference is larger and the accuracy is maintained when the difference is smaller.

Figure 5:
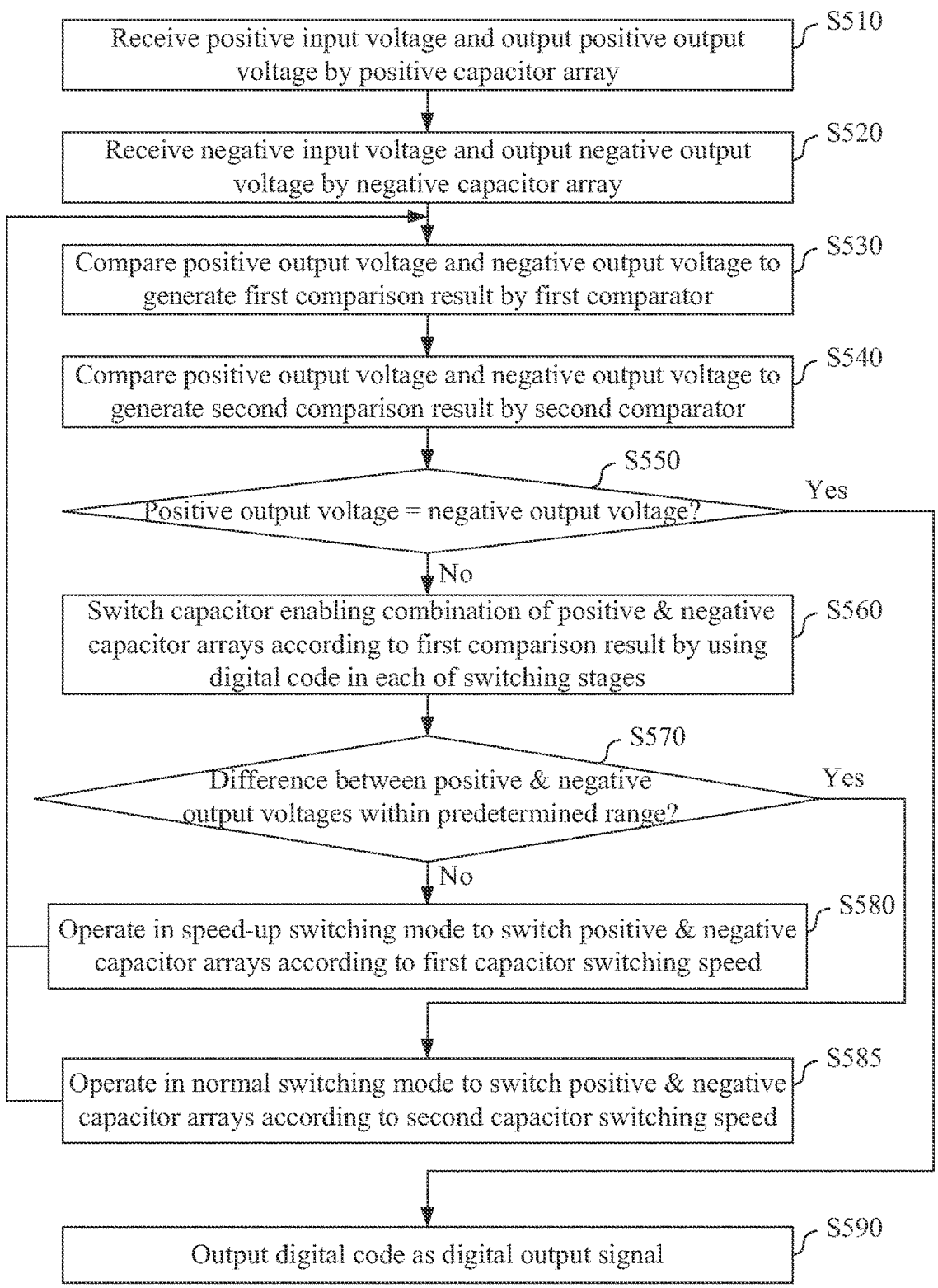
FIG. 5 illustrates a flow chart of an analog-to-digital conversion method having speed-up comparison mechanism according to an embodiment of the present invention.

Reference is now made to FIG. 5. FIG. 5 illustrates a flow chart of an analog-to-digital conversion method 500 having speed-up comparison mechanism according to an embodiment of the present invention.

In addition to the apparatus described above, the present disclosure further provides the analog-to-digital conversion method 500 having speed-up comparison mechanism that can be used in such as, but not limited to, the analog-to-digital conversion circuit 100 in FIG. 1. As illustrated in FIG. 5, an embodiment of the analog-to-digital conversion method 500 includes the following steps.

In step S510, the positive input voltage Vip is received and the positive output voltage Va is outputted by the positive capacitor array 110.

In step S520, the negative input voltage Vip is received and the negative output voltage Vb is outputted by the negative capacitor array 120.

In step S530, the positive output voltage Va and the negative output voltage Vb are compared to generate the first comparison result CR1 by the first comparator 130.

In step S540, the positive output voltage Va and the negative output voltage Vb are compared to generate the second comparison result CR2 by the second comparator 140.

In step S550, the first comparison result CR1 is received by the control circuit 150 to determine whether the positive output voltage Va and the negative output voltage Vb equal to each other according to the first comparison result CR1.

In step S560, when the positive output voltage Va and the negative output voltage Vb does not equal to each other, the control circuit 150 switches the capacitor enabling combination of the positive capacitor array 110 and the negative capacitor array 120 according to the first comparison result CR1 by using the digital code DC in each of the switching stages.

In step S570, the second comparison result CR2 is received by the control circuit 150 to determine whether the difference between the positive output voltage Va and the negative output voltage Vb is within the predetermined range according to the second comparison result CR2.

In step S580, when the difference between the positive output voltage Va and the negative output voltage Vb is beyond the predetermined range, the control circuit 150 operates in the speed-up switching mode to switch the positive capacitor array 110 and the negative capacitor array 120 according to the first capacitor switching speed.

In step S585, when the difference between the positive output voltage Va and the negative output voltage Vb is within the predetermined range, the control circuit 150 operates in the normal switching mode to switch the positive capacitor array 110 and the negative capacitor array 120 according to the second capacitor switching speed, wherein the first capacitor switching speed is larger than the second capacitor switching speed.

After step S580 and step S585, the flow goes back to step S530 to keep performing comparison. When step S550 determines that the positive output voltage Va and the negative output voltage Vb equal to each other, the flow goes to step S590. The control circuit 150 outputs the digital code DC as the digital output signal DOUT.

It is appreciated that the embodiments described above are merely an example. In other embodiments, it should be appreciated that many modifications and changes may be made by those of ordinary skill in the art without departing, from the spirit of the disclosure.

In summary, the present invention discloses the analog-to-digital conversion circuit and the analog-to-digital conversion method having speed-up comparison mechanism that switch capacitors with different capacitor switching speeds according to different differences between the positive output voltage and the negative output voltage such that an operation speed is fastened when the difference is larger and the accuracy is maintained when the difference is smaller.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An analog-to-digital conversion circuit having speed-up comparison mechanism, comprising:
   a positive capacitor array configured to receive a positive input voltage and output a positive output voltage;
   a negative capacitor array configured to receive a negative input voltage and output a negative output voltage;
   a first comparator configured to compare the positive output voltage and the negative output voltage to generate a first comparison result;
   a second comparator configured to compare the positive output voltage and the negative output voltage according to a reference voltage to generate a second comparison result; and
   a control circuit configured to receive the first comparison result and the second comparison result;
   wherein the control circuit switches a capacitor enabling combination of the positive capacitor array and the negative capacitor array according to the first comparison result by using a digital code in each of a plurality of switching stages, and outputs the corresponding digital code as a digital output signal when the positive output voltage and the negative output voltage equal to each other;
   the control circuit, according to the second comparison result, operates in a speed-up switching mode when a difference between the positive output voltage and the negative output voltage is beyond a predetermined range defined by the reference voltage to control the positive capacitor array and the negative capacitor array to switch according to a first capacitor switching speed, and operates in a normal switching mode when the difference is within the predetermined range to control the positive capacitor array and the negative capacitor array to switch according to a second capacitor switching speed, the first capacitor switching speed being larger than the second capacitor switching speed.

2. The analog-to-digital conversion circuit of claim 1, wherein the second comparator comprises:
   a positive comparator configured to compare the positive output voltage and the reference voltage to generate a positive comparison result comprised by the second comparison result; and
   a negative comparator configured to compare the negative output voltage and the reference voltage to generate a negative comparison result comprised by the second comparison result;
   wherein the control circuit is configured to set a range between a positive value and a negative value of the reference voltage as the predetermined range, and determine whether the difference between the positive output voltage and the negative output voltage is within the predetermined range according to the second comparison result.

3. The analog-to-digital conversion circuit of claim 2, wherein the reference voltage is 100 millivolts (mV).

4. The analog-to-digital conversion circuit of claim 1, wherein each of the positive capacitor array and the negative capacitor array comprises:
   a plurality of capacitors;
   a capacitor switching circuit electrically coupled to the capacitors and configured to switch and enable the corresponding capacitors according to the digital code; and
   a plurality of speed-up switching circuits each electrically coupled to a group of corresponding capacitors of the capacitors and configured to simultaneously enable the group of corresponding capacitors according to a speed-up switching signal;
   wherein the control circuit, operating in the speed-up switching mode and in each of the switching stages, enables a target capacitor of the capacitors through the capacitor switching circuit according to the digital code, and simultaneously enables the corresponding capacitors that corresponds to the target capacitor through the speed-up switching circuits according to the speed-up switching signal;

the control circuit, operating in the normal switching mode and in each of the switching stages, only enables the target capacitor of the capacitors through the capacitor switching circuit according to the digital code.

5. The analog-to-digital conversion circuit of claim 1, wherein each of the positive capacitor array and the negative capacitor array comprises:

a plurality of capacitors;

a capacitor switching circuit electrically coupled to the capacitors and configured to switch and enable the corresponding capacitors according to the digital code; and a plurality of delay circuits each electrically coupled to neighboring two of the capacitors, each comprising a plurality of delay units to determine a switching time of the neighboring two of the capacitors, and each configured to bypass at least a part of the delay units according to a speed-up switching signal;

wherein the control circuit, operating in the speed-up switching mode and in each of the switching stages, enables a target capacitor of the capacitors through the capacitor switching circuit according to the digital code, and bypasses at least one of the delay units of one of the delay circuits between the target capacitor and a next capacitor according to the speed-up switching signal;

the control circuit, operating in the normal switching mode and in each of the switching stages, only enables the target capacitor of the capacitors through the capacitor switching circuit according to the digital code.

6. An analog-to-digital conversion method having speed-up comparison mechanism, comprising:

receiving a positive input voltage and outputting a positive output voltage by a positive capacitor array;

receiving a negative input voltage and outputting a negative output voltage by a negative capacitor array;

comparing the positive output voltage and the negative output voltage to generate a first comparison result by a first comparator;

comparing the positive output voltage and the negative output voltage according to a reference voltage to generate a second comparison result by a second comparator;

receiving the first comparison result by a control circuit to switch a capacitor enabling combination of the positive capacitor array and the negative capacitor array according to the first comparison result by using a digital code in each of a plurality of switching stages, and output the corresponding digital code as a digital output signal when the positive output voltage and the negative output voltage equal to each other; and receiving the second comparison result by the control circuit to, according to the second comparison result, operate in a speed-up switching mode when a difference between the positive output voltage and the negative output voltage is beyond a predetermined range defined by the reference voltage to control the positive capacitor array and the negative capacitor array to switch according to a first capacitor switching speed, and operate in a normal switching mode when the difference is within the predetermined range to control the positive capacitor array and the negative capacitor array to switch according to a second capacitor switching speed, the first capacitor switching speed being larger than the second capacitor switching speed.

7. The analog-to-digital conversion method of claim 6, further comprising:

comparing the positive output voltage and the reference voltage to generate a positive comparison result comprised by the second comparison result by a positive comparator comprised by the second comparator;

comparing the negative output voltage and the reference voltage to generate a negative comparison result comprised by the second comparison result by a negative comparator comprised by the second comparator; and setting a range between a positive value and a negative value of the reference voltage as the predetermined range, and determining whether the difference between the positive output voltage and the negative output voltage is within the predetermined range by the control circuit according to the second comparison result.

8. The analog-to-digital conversion method of claim 7, wherein the reference voltage is 100 millivolts.

9. The analog-to-digital conversion method of claim 6, wherein each of the positive capacitor array and the negative capacitor array comprises a plurality of capacitors, a capacitor switching circuit and a plurality of speed-up switching circuits, the capacitor switching circuit electrically coupled to the capacitors and configured to switch and enable the corresponding capacitors according to the digital code, and the speed-up switching circuits each electrically coupled to a group of corresponding capacitors of the capacitors and configured to simultaneously enable the group of corresponding capacitors according to a speed-up switching signal, wherein the analog-to-digital conversion method further comprises:

operating the control circuit in the speed-up switching mode and in each of the switching stages, to enable a target capacitor of the capacitors through the capacitor switching circuit according to the digital code, and to simultaneously enable the corresponding capacitors that corresponds to the target capacitor through the speed-up switching circuits according to the speed-up switching signal;

operating the control circuit in the normal switching mode and in each of the switching stages, to only enable the target capacitor of the capacitors through the capacitor switching circuit according to the digital code.

10. The analog-to-digital conversion method of claim 6, wherein each of the positive capacitor array and the negative capacitor array comprises a plurality of capacitors, a capacitor switching circuit and a plurality of delay circuits, the capacitor switching circuit electrically coupled to the capacitors and configured to switch and enable the corresponding capacitors according to the digital code, and the delay circuits each electrically coupled to neighboring two of the capacitors, each comprising a plurality of delay units to determine a switching time of neighboring two of the capacitors, and each configured to bypass at least a part of the delay units according to a speed-up switching signal, wherein the analog-to-digital conversion method further comprises:

operating the control circuit in the speed-up switching mode and in each of the switching stages, enables a target capacitor of the capacitors through the capacitor switching circuit according to the digital code, and bypasses at least one of the delay units of one of the delay circuits between the target capacitor and a next capacitor according to the speed-up switching signal;

operating the control circuit in the normal switching mode and in each of the switching stages, only enables the target capacitor of the capacitors through the capacitor switching circuit according to the digital code.

* * * * *